United States Patent [19]

Ruetz

[11] Patent Number: 5,164,889
[45] Date of Patent: Nov. 17, 1992

[54] GATE MULTIPLEXED LOW NOISE CHARGE PUMP

[75] Inventor: J. Eric Ruetz, San Bruno, Calif.

[73] Assignee: Samsung Semiconductor, Inc., San Jose, Calif.

[21] Appl. No.: 775,629

[22] Filed: Oct. 10, 1991

[51] Int. Cl.[5] .............................................. H03L 7/00
[52] U.S. Cl. .................................... 363/60; 331/1 A; 331/17; 331/25; 328/155; 307/511
[58] Field of Search ................... 363/60; 331/1 A, 11, 331/16, 17, 25, DIG. 2; 328/133, 134, 155; 307/511, 516

[56] References Cited

U.S. PATENT DOCUMENTS 5,068,626 11/1991 Takagi et al. ....................... 331/17

*Primary Examiner*—Emanuel T. Voeltz
*Attorney, Agent, or Firm*—Townsend and Townsend

[57] ABSTRACT

A charge pump having gate control voltages multiplexed to gates of FET driver circuits to precisely control charge injected by the charge pump to a low pass filter network. Large capacitors between the supply voltages and the respective gate control voltage derived from the particular supply voltage provide greater noise immunity which further reduces phase errors introduced by injected charge variations. The large capacitors help to hold the gate voltages constant, further controlling the injected charge.

5 Claims, 3 Drawing Sheets

GATE MULTIPLEXED LOW NOISE CHARGE PUMP

BACKGROUND OF THE INVENTION

The present invention relates generally to Phase-Lock Loop (PLL) circuits and more specifically to a charge pump circuit injecting low noise and low charge into particular PLL circuits.

FIG. 3 is a block diagram of a conventional PLL circuit 100. The PLL circuit 100 of the prior art uses a charge pump 102 in conjunction with a low pass filter (LPF) 104 to establish a control voltage for a voltage-controlled oscillator (VCO) 106. One purpose of a PLL circuit is to produce an output clock signal (CLK OUT) having a frequency proportional to an input signal (SIG IN). A phase/frequency detector (PFD) 108 compares the input signal and a feedback signal from the VCO 106 to determine any differences in phase or frequency between the two signals. The PFD 108 controls the operation of the charge pump 102 through assertions and negations of two control signals, an UP signal and a DOWN signal. The charge pump 102 responds to the UP and DOWN signals in different ways, depending upon particular implementations of the PLL circuit 100. In one instance, the charge pump 102 responds to an assertion of the UP signal to provide more voltage to the LPF 104 which causes a greater voltage at the VCO 106 input. For certain implementations, the VCO 106 responds to a greater voltage at its input by increasing the output clock's frequency to a new value determined by the magnitude of the voltage at the VCO 106 input. If this new value has a frequency greater than the input signal, the PFD 108 detects a frequency difference between the feedback signal and the input signal, causing it to assert the DOWN signal to the charge pump 102. The charge pump 102 responds to the DOWN signal assertion by causing the voltage level at the VCO 106 input to decrease. The decreased voltage level decreases the output signal's frequency. The PFD 108 continually compares the input signal with the feedback signal and periodically asserts UP and DOWN depending upon the comparison results.

One difficulty with the charge pumps 102 of the prior art relate to precise control over the magnitude of the charge which it injects into the LPF 104. The charge pump 102 includes one or more driver circuits which the UP and DOWN signals control. Many factors may affect the imprecise control over the injected charge. These factors include noise coupled to driver circuits of the charge pump or switching times for the driver circuit elements. If the driver circuits are slow to respond to the UP and DOWN signals, or if the driver circuits have a minimum period for which they must be active which is greater than assertion periods for the UP and DOWN signals, then the imprecise control introduces phase errors in the PLL circuit 100. The noise level fluctuations superimposed over supply and control voltages for the driver circuits will also introduce phase jitters. The charge pump can introduce phase errors or phase jitter if its driver circuit's activation control voltage varies. Variation in the activation voltage can depend upon supply line voltages. One example of a circuit having variable activating voltages would be a driver circuit controlled by a field effect transistor coupled to a current path of the driver. Phase error results from too much or too little injected charge. Phase jitter, however, results from random phase changes caused by noise.

It is therefore an object of the present invention to provide a charge pump having controllable charge injection and low noise characteristics to reduce phase errors and jitters of the PLL circuit. An additional object of the present invention is to have a charge pump which has a predeterminable activation voltage without control voltage degradation during activation.

SUMMARY OF THE INVENTION

The present invention provides method and apparatus for improving charge pump performance. The charge pump improves performance by reducing noise coupled from power supplies as well as providing for an ability to inject a lower quantum of charge per each assertion of short duration UP or DOWN control signals. The charge pump provides driver circuits and a bias circuit with a predictable activation voltage thereby reducing phase error introduction.

According to one aspect of the invention, the improved charge pump comprises a driver circuit for sourcing and sinking a current to a low pass filter network. The driver circuit includes field effect transistors having a conductance between a source and drain controlled by a voltage provided to a gate of the transistor. A bias circuit receives supply voltages and establishes necessary voltage levels for the charge pump. A gate multiplexing mechanism coupled between the gates of the driver circuit transistors and the bias circuit is responsive to the UP and DOWN signals to control the sourcing and sinking of current relative a charge pump output and the low pass filter network. Relatively large capacitors coupled to the gates of the driver transistors filter and smooth noise fluctuations of the gate voltage.

The present invention of controlling injected charge offers an advantage over prior methods wherein injected charge was dependent on output voltage. The present invention's injected charge does not depend upon output voltage. The present invention allows output current to be reduced, thereby decreasing filter component sizes and costs.

Reference to the remaining portions of the specification and the drawings may realize a further understanding of the nature and advantages of the present invention.

DESCRIPTION OF THE PREFERRED EMBODIMENT

Figure 1:
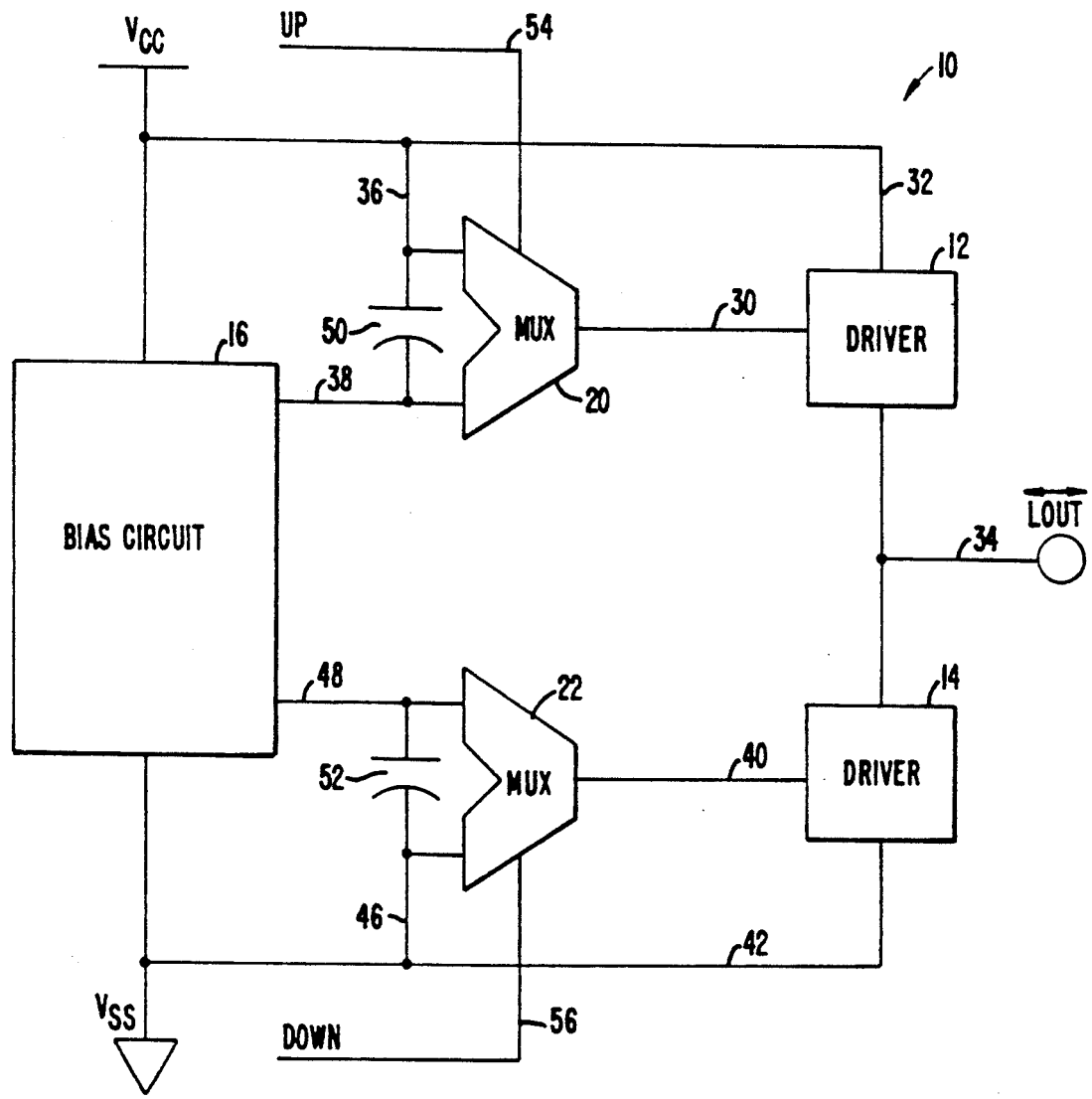
FIG. 1 is a schematic block diagram of a charge pump 10 according to the present invention.

FIG. 1 is a schematic block diagram of a charge pump 10 according to the present invention. The charge pump 10 includes two driver circuits, a sourcing current driver 12 and a sinking current driver 14, a bias circuit 16 and two gate multiplexers, a source driver multiplexer 20 and a sink driver multiplexer 22. The sourcing current driver 12 receives a first control voltage on a line 30 from the source drive multiplexer 20 to control a current flow from a first supply voltage (Vcc) on a line 32 to an output terminal at a line 34. The bias circuit 16 provides the first supply voltage to the source driver multiplexer 20 via a line 36. A line 38 provides a first gate control bias voltage to the source driver multiplexer 20.

The sinking current driver 14 receives a second control voltage on a line 40 from the sink drive multiplexer 22 to control a current flow from the output terminal at a line 34 to a second supply voltage (Vss) on a line 42. The bias circuit 16 provides the second supply voltage to the sink driver multiplexer 22 via a line 46. A line 48 provides a second gate bias control voltage to the sink driver multiplexer 22.

A first capacitor 50 between the line 36 and the line 38 and a second capacitor 52 between the line 46 and the line 48 filter and smooth the first and second gate control bias voltages, respectively. The source driver multiplexer 20 is responsive to a first control signal, the UP signal, received on a line 54 to couple one of the voltage levels on the lines 36 and 38 to the line 30. A negation of the UP signal couples the first supply voltage to the line 30. The sourcing current driver 12 does not conduct current from the line 32 to the output terminal at the line 34 when the first control voltage at the line 30 is approximately equal to the first supply voltage. An assertion of the UP signal couples the first gate control voltage at the line 38 to the first control voltage at the line 30. The voltage level of the first gate control bias voltage results in conduction of current from the line 32 to the output terminal on the line 34 when the first control voltage at the line 30 approximately equals the first gate control voltage.

The sink driver multiplexer 22 is responsive to a second control signal, the DOWN signal, received on a line 56 to couple one of the voltage levels on the lines 46 and 48 to the line 40. A negation of the DOWN signal couples the second supply voltage to the line 40. The sinking current driver 14 does not conduct current from the output terminal at the line 34 to the line 42 when the second control voltage at the line 40 is approximately equal to the second supply voltage. An assertion of the DOWN signal couples the second gate control voltage at the line 48 to the second control voltage at the line 40. The voltage level of the second gate control bias voltage results in conduction of current from the output terminal on the line 34 to the line 42 when the second control voltage at the line 40 approximately equals the second gate control voltage.

In operation, the charge pump 10 initially receives both UP and DOWN deasserted. Deassertion of the UP signal directs the first supply voltage at line 36 to the line 30 as the first control voltage, inhibiting conduction of current to the output terminal at the line 34. Similarly, deassertion of the DOWN signal directs the second supply voltage at the line 36 to the line 40 as the second control voltage, inhibiting conduction of current from the line 34 to the line 42. The control signals UP and DOWN are never asserted at the same time. Assertion of the UP control signal results in the sourcing current driver 12 sourcing current to the output terminal at the line 34. Assertion of the DOWN signal results in the sinking current driver 14 conducting current from the output terminal at the line 34 to the line 42.

The charge pump 10 is responsive to the UP and DOWN signals to precisely control the charge injected to a device coupled to the output terminal at the line 34. The charge injected is positive for assertions of the UP signal and negative for assertions of the DOWN signal. That is, relative to the output terminal at the line 34, positive charge results from current flow out of the ouput terminal to the LPF 104. Similarly, negative charge results from a flow of current from the LPF 104 to the output terminal. The capacitors 50 and 52 remove noise from the voltages provided from the bias circuit 16 and stabilize the control voltage. Filtering the noise reduces errors in the amount of random or harmonic-related charge injected relative to the output terminal at the line 34 in response to assertions of the UP and DOWN control signals.

Figure 2:
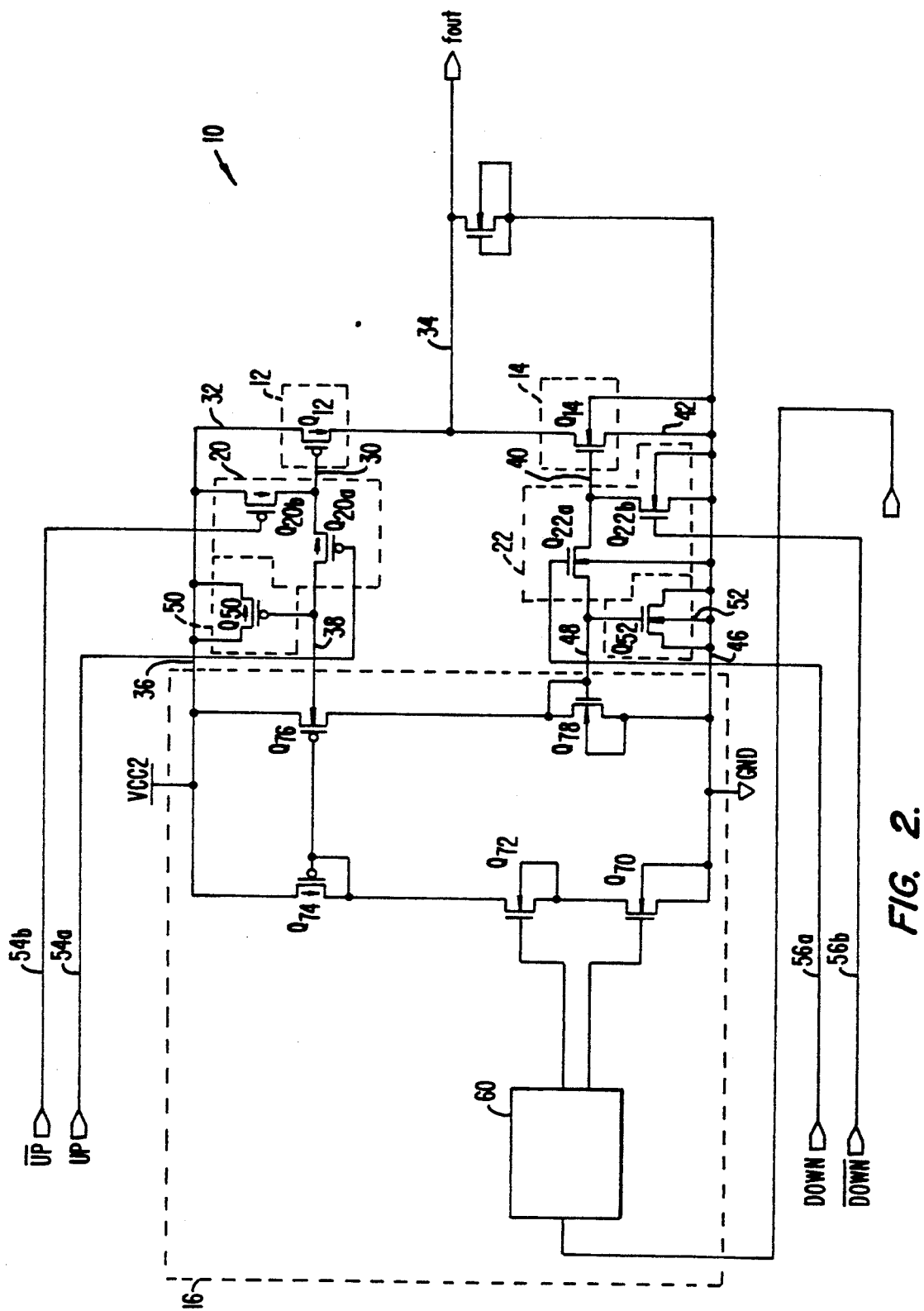
FIG. 2 is a detailed schematic diagram of a preferred embodiment of a charge pump according to the present invention.
Figure 3:
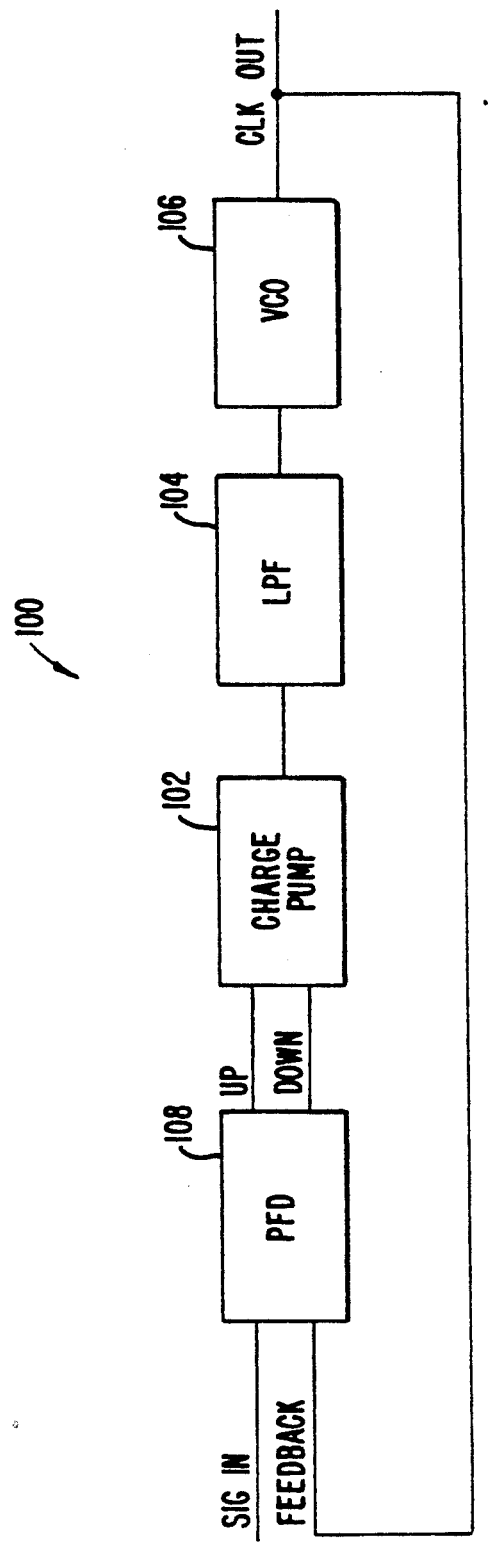
FIG. 3 is a block diagram of one type of a conventional Phase Lock Loop circuit 100 for which the present invention is useful.

FIG. 2 is a detailed schematic diagram of a preferred embodiment of a charge pump according to the present invention. The numbered components of FIG. 2 correspond to the similarly numbered components of FIG. 1. Specifically, the charge pump 10 includes field effect transistors (FETs) for the drivers, with a p-channel FET $Q_{12}$ operating as the sourcing current driver 12. The p-channel FET $Q_{12}$ has a source coupled to the first supply voltage through the line 32. A gate of the p-channel FET $Q_{12}$ couples to the source driver multiplexer 20 through the line 30 and a drain of the FET $Q_{12}$ couples to the output terminal at the line 34. The charge pump 10 includes an n-channel FET $Q_{14}$ operating as the sinking current driver 14. The n-channel FET $Q_{14}$ has a source coupled to the second supply voltage through the line 42. A gate of the p-channel FET $Q_{14}$ couples to the sink driver multiplexer 22 through the line 40 and a drain of the FET $Q_{14}$ couples to the output terminal at the line 34.

The source driver multiplexer 20 comprises two p-channel FETs, a first source multiplexer FET $Q_{20a}$ and a second sink multiplexer FET $Q_{20b}$. The source driver multiplexer 20 is responsive to the UP signal on line 54 of FIG. 1. In the preferred embodiment of the present invention, the UP control signal is made up of complementary control signals. This means that an assertion of the UP signal on the line 54 of FIG. 1 actually results in an assertion of UP on a line 54a and a negation of $\overline{UP}$ on a line 54b. The line 38 couples a source of the first source multiplexer FET $Q_{20a}$ to the bias circuit 16 and the line 30 couples a drain of the first source multiplexer FET $Q_{20a}$ to the gate of the sourcing current driver FET $Q_{12}$. The line 30 also couples a drain of the second source multiplexer FET $Q_{20b}$ to the gate of the sourcing current driver FET $Q_{12}$. The line 36 couples a source of the second source multiplexer FET $Q_{20b}$ to the bias circuit 16. The capacitor 50 comprises, in the preferred embodiment, a relatively large FET having a source and drain both coupled to the line 36 and a gate coupled to the line 38.

Similarly, the sink driver multiplexer 22 comprises two n-channel FETs, a first sink multiplexer FET $Q_{22a}$ and a second sink multiplexer FET $Q_{22b}$. The sink driver multiplexer 22 is responsive to the DOWN signal on line 56 of FIG. 1. In the preferred embodiment of the present invention, the DOWN control signal is made up of complementary control signals. This means that an assertion of the DOWN signal on the line 56 of FIG. 1 actually results in an assertion of DOWN on a line 56a and a negation of $\overline{DOWN}$ on a line 56b. The line 48 couples a source of the first sink multiplexer FET $Q_{22a}$ to the bias circuit 16 and the line 40 couples a drain of the first sink multiplexer FET $Q_{22a}$ to the gate of the sinking current driver FET $Q_{14}$. The line 40 also couples a drain of the second sink multiplexer FET $Q_{22b}$ to the gate of the sinking current driver FET $Q_{14}$. The line 46 couples a source of the second sink multiplexer FET $Q_{22b}$ to the bias circuit 16. The capacitor 52 comprises, in the preferred embodiment, a relatively large FET having a source and drain both coupled to the line 46 and a gate coupled to the line 48.

The bias circuit 16 comprises a voltage setting circuit 60 which establishes control voltages to activate a first bias FET $Q_{70}$ and a second bias FET $Q_{72}$. A source of the first bias FET $Q_{70}$ receives the second supply voltage from a supply outside the charge pump 10 circuit. A drain of the first bias FET $Q_{70}$ is coupled to a source of the second bias FET $Q_{72}$. A first voltage from the voltage setting circuit 60 is coupled to the gate of the first bias FET $Q_{70}$ and a second voltage from the voltage setting circuit 60 is coupled to a gate of the second bias FET $Q_{72}$. A drain of the second bias FET $Q_{72}$ is coupled to a drain of a third bias FET $Q_{74}$. The third bias FET $Q_{74}$ has a gate coupled to the drain and a source coupled to a supply for the first supply voltage outside the charge pump 10 circuit. The first, second and third FETs $Q_{70}$–$Q_{74}$ establish the first gate control bias voltage level for the line 38 while the line 36 receives the voltage level from the first supply voltage level present at the source of the third bias FET $Q_{74}$. A second series of FETs, a fourth bias FET $Q_{76}$ and a fifth bias FET $Q_{78}$, establish the second gate control voltage at the line 48. The fourth bias FET $Q_{76}$ has a gate coupled to the gate of the third bias FET $Q_{74}$, and a source coupled to the source of the third bias FET $Q_{74}$. The fourth bias FET $Q_{76}$ has a drain coupled to a drain of the fifth bias FET $Q_{78}$. A gate of the fifth bias FET $Q_{78}$ is coupled to its drain and a source is coupled to the source of the first bias FET $Q_{70}$. The gate of the fifth bias FET $Q_{78}$ provides the second gate control voltage to the line 48. The voltage setting circuit 60 is responsive to an assertion (active low in the preferred embodiment) of a sleep signal SL to inhibit operation. The particular construction of the voltage setting circuit 60 does not directly contribute to the present invention. Any number of low noise stable circuits for supplying precise voltages could be used for the voltage setting circuit 60.

In operation, a deassertion of the SL signal to the voltage setting circuit establishes a current flow through the first series of bias FETs $Q_{70}$–$Q_{74}$. This value of the third bias FET $Q_{74}$ is chosen to put the voltage level of the first gate control voltage at a desired level. The voltage level of the first gate control voltage will be at least one threshold below that of the first supply voltage level, and could be more. The actual voltage level is selected by design considerations as to how responsive the sourcing current driver 12 is to the gate bias voltage to turn on or off. The current in the second series of bias FETs $Q_{76}$–$Q_{78}$ mirrors this current in the first series of bias FETs $Q_{70}$–$Q_{74}$. The size of the fourth bias FET $Q_{76}$ scales the current in the second series of bias FETs. That is, if the size of the fourth bias FET $Q_{76}$ is four times the size of the third bias FET $Q_{74}$, as it is in the preferred embodiment, then the current in the second series of bias FETs will be four times as large as the value in the first series of bias FETs. An important aspect is to have $Q_{12}$ and $Q_{14}$ current equal. Equal currents are established by making the ratio of $Q_{12}$ to $Q_{74}$ four times. The characteristics of the fifth bias FET $Q_{78}$ are set to establish the second gate control bias voltage at a desired level above the second supply voltage level. As before, design characteristics as to responsiveness of the sinking current driver 14 influence the actual value of the second gate control bias voltage. In any event, the value of the second gate control bias voltage will be at least one threshold above the voltage level of the second supply voltage. In this fashion, the bias circuit 16 supplies the rest of the charge pump 10 with two voltage levels and a first and second gate control bias voltage. The multiplexers 20 and 22 determine, responsive to the assertions of the UP and DOWN signals, which voltages are supplied to the particular drivers. The capacitors 50 and 52 filter noise from the bias circuit 16 and help to hold the gate voltages constant. Additionally, the size of the capacitors 50 and 52 are sufficiently large relative to a current loading capacity of the multiplexers 20 and 22 to provide some current when the driver circuits are enabled by assertions of the respective control signals UP and DOWN. Supplying current during enablement of the particular driver circuits helps to prevent degradation of the gate control voltage levels, resulting in better performance of the multiplexed charge pump 10. Some current is necessary with this configuration of gate multiplexing to charge a gate capacitance associated with the driver FET $Q_{12}$ and FET $Q_{14}$ of the preferred embodiment.

In conclusion, the present invention simply and efficiently provides precise control over injected charge into driver circuits. The charge pump incorporating the present invention has noise immunity further limiting phase errors introduced by fluctuations in power supply voltages. An advantage of gate multiplexing control over the driver circuits is that actual current levels are not dependent upon line 34 voltage levels or the supply noise. While the above is a complete description of the preferred embodiments of the present invention, various alternatives, modifications, and equivalents are possible. Therefore, the above description should not be taken as limiting the scope of the present invention which the appended claims define.

What is claimed is:

1. A charge pump for controlling a current relative to an output terminal responsive to an UP and a DOWN signal, comprising:
   a first field effect transistor having a source coupled to a first supply voltage line, a drain coupled to the output terminal and a gate coupled to a first control node, with said first transistor responsive to an assertion of a first control voltage at said first control node to conduct current from said first supply voltage line to the output terminal and further responsive to an assertion of a first supply voltage at said first control node to inhibit current flow from said first supply voltage line to the output terminal;
   a second field effect transistor having a source coupled to a second supply voltage line, a drain coupled to the output terminal and a gate coupled to a second control node, with said second transistor responsive to an assertion of a second control voltage at said second control node to conduct current from the output terminal to the second supply voltage line and further responsive to an assertion of a second supply voltage at said second control node to inhibit current flow from the output terminal to said second supply voltage line;
   a bias circuit responsive to said first and said second supply voltage for providing a first bias voltage and a second bias voltage;
   a first multiplexer for coupling said first bias voltage received at a first node to said first transistor gate in response to an assertion of the UP signal and for coupling said first supply voltage received at a second node to said first transistor gate in response to a negation of the UP signal;

a multiplexer for coupling said second bias voltage received at a third node to said second transistor gate in response to an assertion of the DOWN signal and for coupling said second supply voltage received at a fourth node to said second transistor gate in response to a negation of the second control signal.

2. The charge pump of claim 1 further comprising:

a first capacitor between said first node and said second node; and a second capacitor between said third node and said fourth node.

3. A charge pump, comprising:

a bias circuit for providing a first and a second supply voltage on a first and a second supply line and a first and second bias voltage on a first and a second control line;

a first and a second multiplexer coupled to said bias circuit, each said multiplexer responsive to a select signal for selecting a particular one of a first and a second input to couple to an output, and each said multiplexer coupling its second input to said output when said select signal is asserted and coupling said first input to said output when said select signal is deasserted, said first multiplexer's first input coupled to said first supply line, said first multiplexer's second input coupled to said first bias control voltage and said first multiplexer's select signal corresponding to an UP signal, and said second multiplexer's first input coupled to said second supply line, said second multiplexer's second input coupled to said second bias voltage and said second multiplexer's select signal corresponding to a DOWN signal; and a first and a second driver each having a first and a second node and a control node, wherein each said driver is responsive to a particular voltage level at said control node to provide a conductive path between said first node and said second node, said first driver's first node coupled to said first voltage supply line, said first driver's second node coupled to an output node, and said first driver's control node coupled to said first multiplexer's output, said second driver's first node coupled to second voltage supply line, said second driver's second node coupled to said output node, and said second driver's control node coupled to said second multiplexer's output.

4. The charge pump according to claim 3 wherein each said driver comprises a field effect transistor having a gate node coupled to said control node.

5. A method for operating, in response to an UP and a DOWN signal, a charge pump having a sourcing current driver responsive to a first control voltage at a first control node to source current from a first supply voltage line to an output terminal, a sinking current driver responsive to a second control voltage at a second control node to sink current from the output terminal to a second supply voltage line and a bias circuit for providing a first supply voltage to the first supply voltage line, a second supply voltage to the second supply voltage line, the first control voltage to a first control line and the second control voltage to a second control line, comprising the steps of:

multiplexing a particular one of the first supply voltage and the first control voltage to the first control node depending upon a status of the UP signal, with the first supply voltage asserted at the first control node if the UP signal is deasserted which inhibits current flow from the first supply voltage line to the output terminal, otherwise with the first control voltage asserted at the first control node if the UP signal is asserted; and multiplexing a particular one of the second supply voltage and the second control voltage to the second control node depending upon a status of the DOWN signal, with the second supply voltage asserted at the second control node if the DOWN signal is deasserted which inhibits current flow from the output terminal to the second supply voltage line, otherwise with the second control voltage asserted at the second control node if the second signal is asserted.

* * * * *